United States Patent
Hou et al.

(10) Patent No.: US 10,522,614 B2
(45) Date of Patent: Dec. 31, 2019

(54) METHOD TO FABRICATE CAPACITANCE-MATCHING FET AND RELATED DEVICE

(71) Applicant: GLOBALFOUNDRIES Singapore Pte. Ltd., Singapore (SG)

(72) Inventors: Yongtian Hou, Singapore (SG); Khee Yong Lim, Singapore (SG); Ming-Tsang Tsai, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/904,004

(22) Filed: Feb. 23, 2018

(65) Prior Publication Data

US 2019/0267446 A1    Aug. 29, 2019

(51) Int. Cl.

| | |
|---|---|
| *H01L 29/788* | (2006.01) |
| *H01L 49/02* | (2006.01) |
| *H01L 29/51* | (2006.01) |
| *H01L 29/78* | (2006.01) |
| *H01L 27/108* | (2006.01) |
| *H01L 21/768* | (2006.01) |
| *H01L 27/11507* | (2017.01) |
| *H01L 29/423* | (2006.01) |
| *H01L 21/28* | (2006.01) |

(52) U.S. Cl.
CPC ........ *H01L 28/56* (2013.01); *H01L 21/76877* (2013.01); *H01L 27/10852* (2013.01); *H01L 27/11507* (2013.01); *H01L 29/40111* (2019.08); *H01L 29/4232* (2013.01); *H01L 29/516* (2013.01); *H01L 29/78391* (2014.09)

(58) Field of Classification Search
None
See application file for complete search history.

(56) References Cited

U.S. PATENT DOCUMENTS

| | | |
|---|---|---|
| 6,335,550 B1 | 1/2002 | Miyoshi et al. |
| 6,469,334 B2 | 10/2002 | Arita et al. |

(Continued)

OTHER PUBLICATIONS

Salahuddin et al., "Use of Negative Capacitance to Provide Voltage Amplification for Low Power Nanoscale Devices", Nano Letters, vol. 8, No. 2, 2008, pp. 405-410.

(Continued)

*Primary Examiner* — Joseph C. Nicely
*Assistant Examiner* — Lamont B Koo
(74) *Attorney, Agent, or Firm* — Ditthavong & Steiner P. C.

(57) ABSTRACT

Methods for producing FETs with negative capacitance and the resulting device are disclosed. Embodiments include forming a gate stack over a semiconductor substrate by: forming a gate oxide over the semiconductor substrate; forming a first metal gate electrode over the gate oxide; forming a dummy gate over the metal gate electrode; and forming sidewall spacers on first and second sides of the gate stack; forming an ILD over the substrate and gate stack; removing the dummy gate and at least a portion of sidewall spacers to form an opening; forming a ferro-electric (FE) layer in the opening; and forming a second metal gate electrode over the FE layer.

19 Claims, 8 Drawing Sheets

(56) References Cited

U.S. PATENT DOCUMENTS

| | | | |
|---|---|---|---|
| 6,908,802 B2 | 6/2005 | Ramesh | |
| 8,785,995 B2 | 7/2014 | Dubourdieu et al. | |
| 9,679,893 B2 | 6/2017 | Yan et al. | |
| 2007/0004049 A1* | 1/2007 | Nasu | H01L 29/495 438/3 |
| 2014/0110798 A1* | 4/2014 | Cai | H01L 29/78 257/410 |
| 2016/0005749 A1 | 1/2016 | Li et al. | |
| 2016/0064228 A1* | 3/2016 | van Bentum | H01L 21/28185 257/295 |
| 2016/0064510 A1* | 3/2016 | Mueller | H01L 29/516 257/295 |
| 2017/0365719 A1 | 12/2017 | Chen et al. | |

OTHER PUBLICATIONS

Merritt, "FinFET's Father Forecasts Future : Meet the Negative-Capacitance FET", News & Analysis, EE Times, Apr. 1, 2016, 3 Pages.

Li et al., "Sub-60mV-Swing Negative-Capacitance FinFET without Hysteresis", IEEE International Electron Devices Meeting (IEDM), Dec. 7-9, 2015, pp. 620-623.

Lee et al., "Prospects for Ferroelectric HfZrOx FETs with Experimentally CET=0.98nm, SSfor=42mV/dec, SSrev=28mV/dec, Switch-OFF<0.2V, and Hysteresis-Free Strategies", IEEE International Electron Devices Meeting (IEDM), Dec. 7-9, 2015, pp. 616-619.

Office Action for the related Taiwanese patent application No. 107110695, dated Nov. 26, 2018, 10 pages.

\* cited by examiner

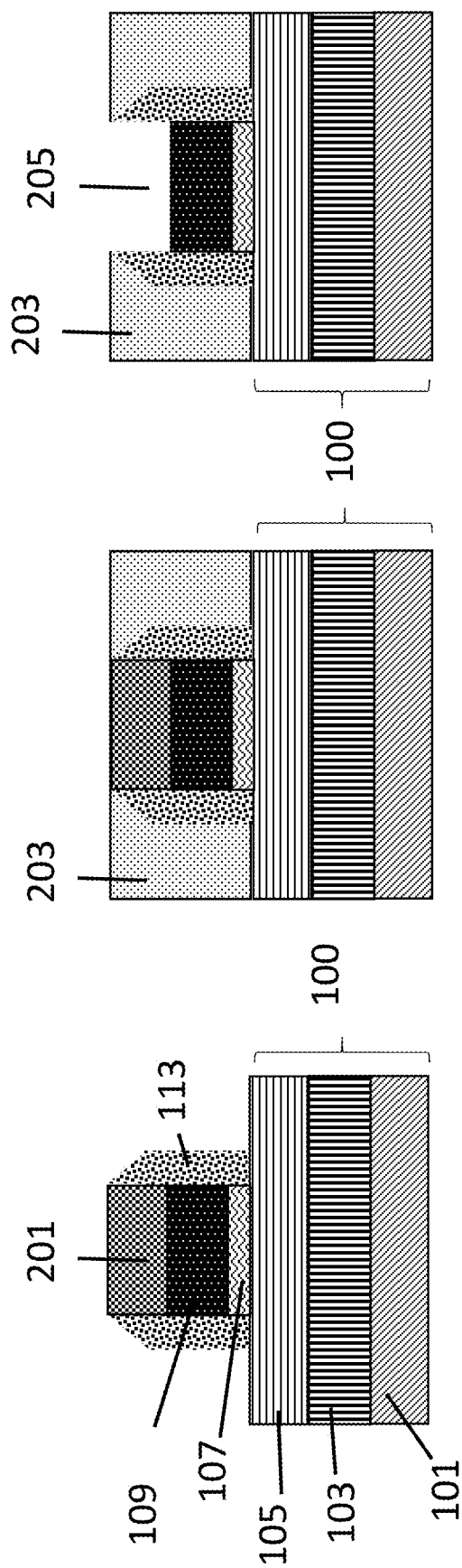

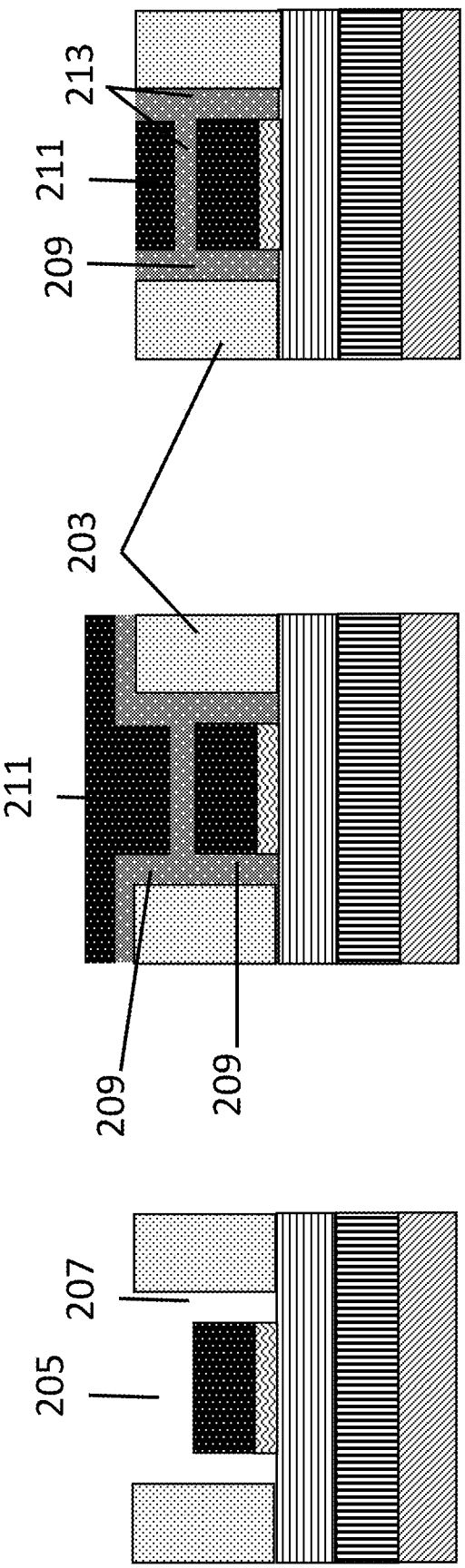

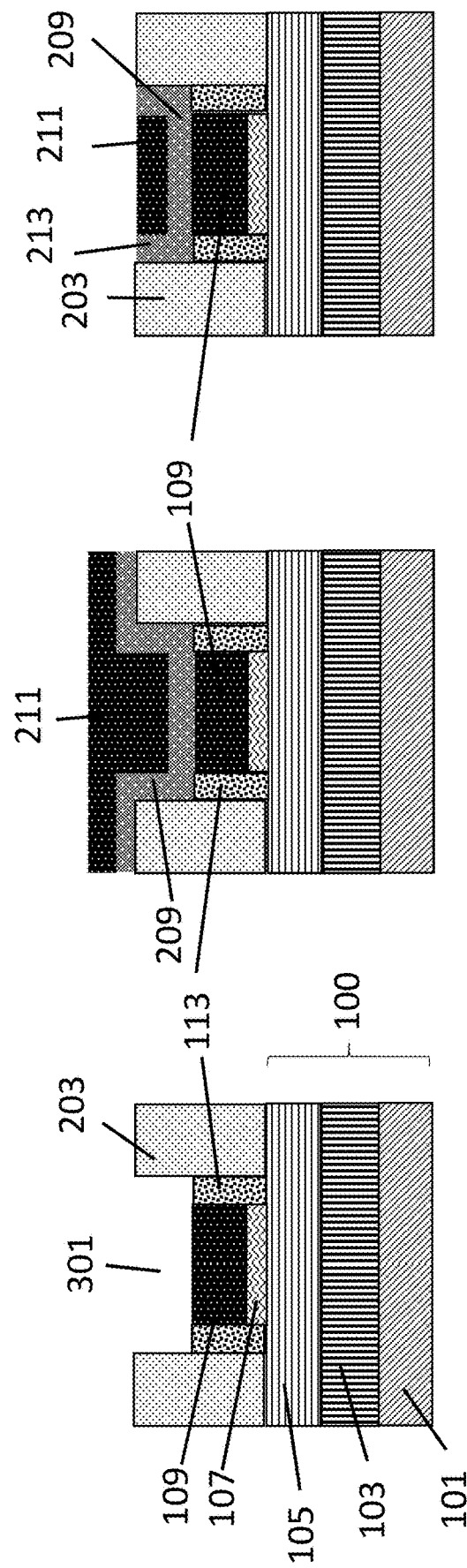

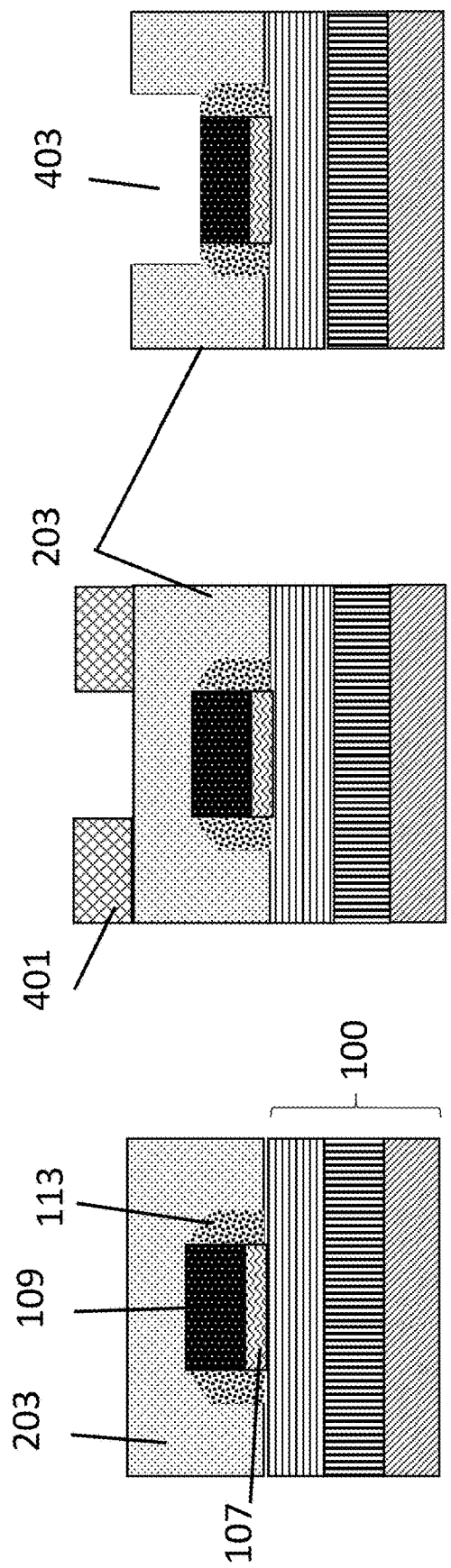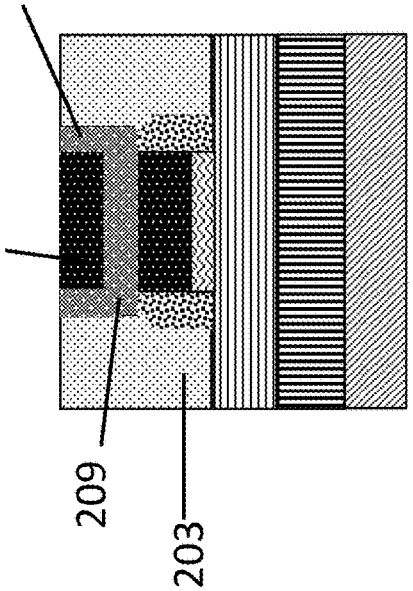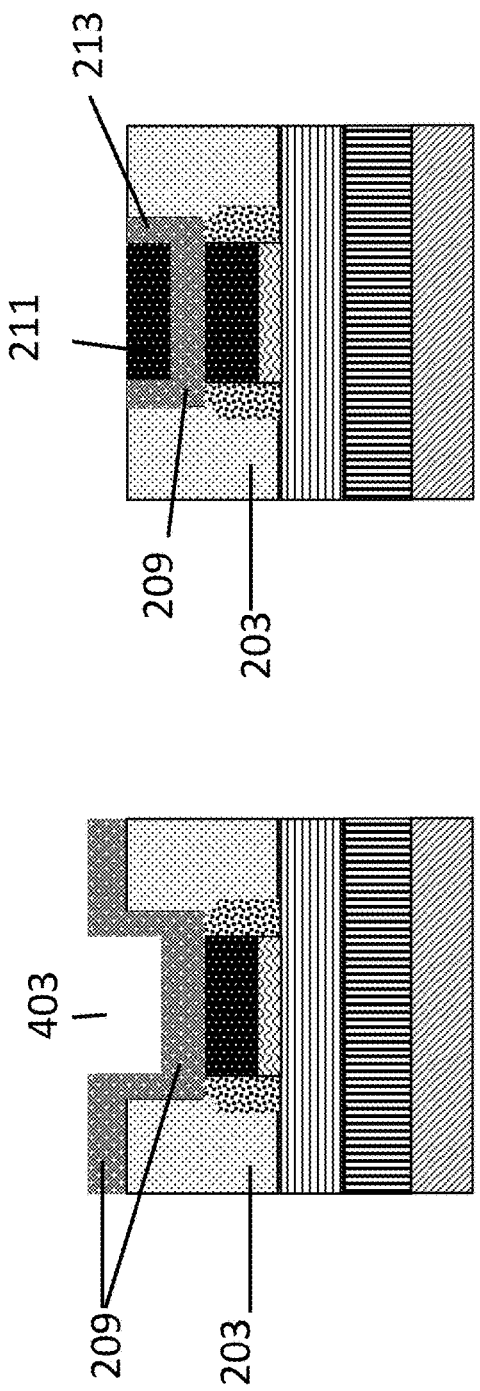
FIG. 4A  FIG. 4B  FIG. 4C  FIG. 4D  FIG. 4E

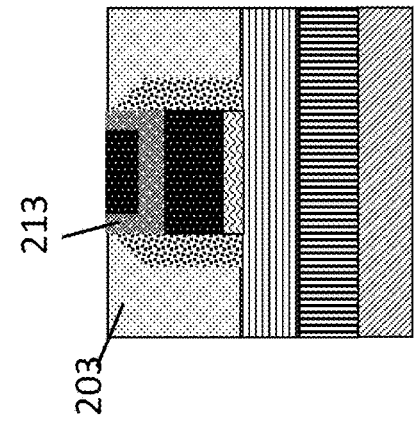
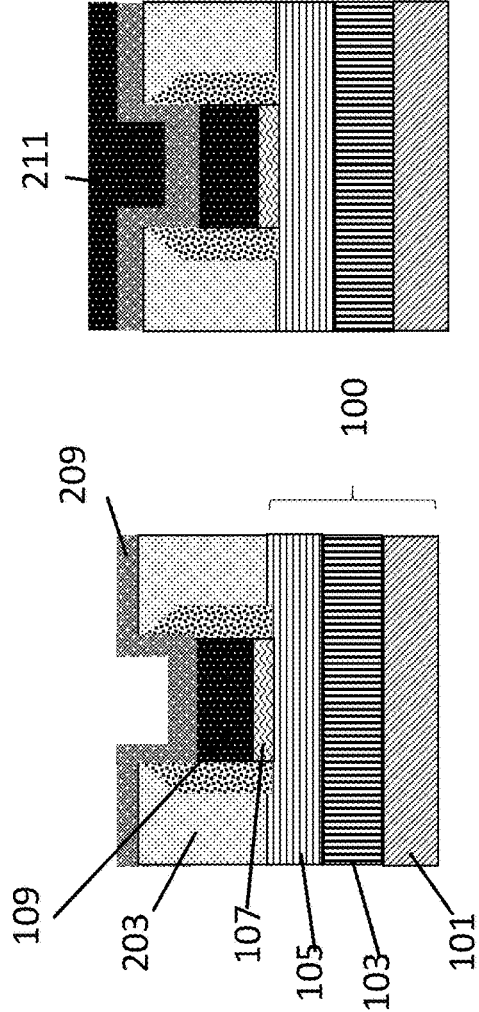
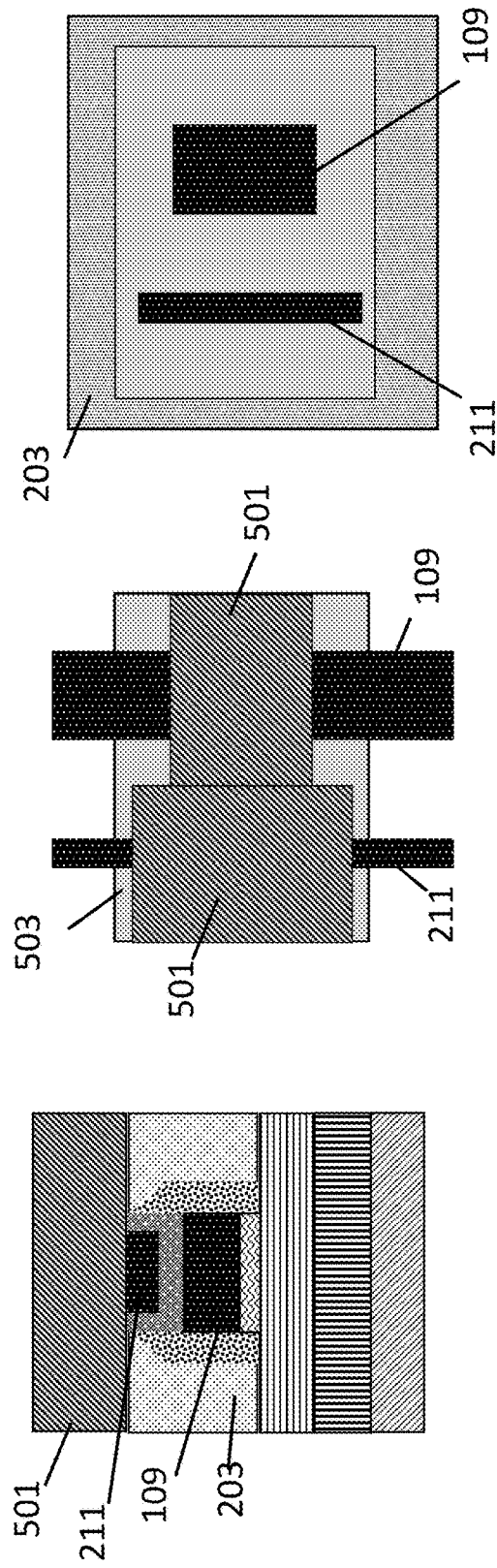
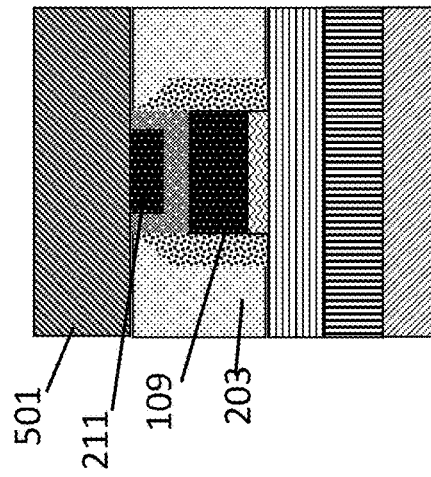

METHOD TO FABRICATE CAPACITANCE-MATCHING FET AND RELATED DEVICE

TECHNICAL FIELD

The present disclosure relates to semiconductor fabrication. In particular, the present disclosure relates to field effect transistors (FETs) in advanced technology nodes.

BACKGROUND

A negative-capacitance (NC) in nanoscale devices have been previously developed to provide voltage amplification for low power nanoscale devices such as FinFETs and metal-oxide-semiconductor field-effect transistors (MOSFETs). NC MOSFETs (NC-FETs) have been recently developed which utilizes a ferroelectric (FE) material to achieve negative capacitance and modulate gate voltage to achieve low subthreshold swing (SS) of MOSFET. In order to achieve low power consumption for Internet of Things (IoT) applications, a low voltage drain bias (Vdd) is needed which requires a low SS of the MOSFET. Current devices do not meet these criteria.

Current devices include a negative capacitor fabricated on top of a complementary-metal-oxide semiconductor (CMOS), wherein the negative capacitor is operated as a voltage gain (Vg) amplifier. Challenges of incorporating FE into gate-first or gate-last processes exist. With gate-first processing, the FE material suffers from a high thermal budget of a source/drain (S/D) annealing, resulting in generation of defects, high leakage and voltage (Vt) hysteresis. When FE material is incorporated in gate-last CMOS processing, it is difficult to fill two gate stacks in a short gate length trench. Moreover, existing gate-last n-type metal gates cannot withstand annealing temperature (e.g., 600° C.), which limits the FE material engineering.

It is critical to match the capacitance between the FE and CMOS. As a result, a NC-FET process with tunable NC is critical for a NC-FET application. With conventional structures challenges exist with having non-hysteretic NC-FET for various width/length (W/L) scaling. As gate length (L) changes, the FE/gate oxide and Si substrate cap scale, however, the gate-to-drain cap does not. When a "balance" is lost NC-FET no longer operates like a proper NC-FET. As device width (W) changes, the balance changes as well. For extended gate (EG) and double gate (DG) FETs with a thick oxide input/output (I/O), which have a much different gate cap compared to single gate (SG) FETs, there is no clear way to "balance" and obtain a negative cap on both types of FETs. Accordingly, there exist concerns about the ease of design, namely how to obtain the behavior across all L and W dimensions for both SG and EG/DG devices.

A need therefore exists for methodology enabling the formation of NC-FET with existing CMOS processing and the resulting device.

SUMMARY

An aspect of the present disclosure is to fabricate a NC-FET using existing CMOS processing, which permits the introduction of NC to reduce MOSFET SS, while maintaining the MOSFET drive current performance. Another aspect of the present disclosure is to match capacitance between the capacitance of the FE and CMOS. A NC-FET process with tunable NC is critical for NC-FET application.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a gate stack over a semiconductor substrate by: forming a gate oxide over the semiconductor substrate; forming a first metal gate electrode over the gate oxide; forming a dummy gate over the metal gate electrode; and forming sidewall spacers on first and second sides of the gate stack; forming an interlayer dielectric (ILD) over the substrate and gate stack; removing the dummy gate and at least a portion of sidewall spacers to form an opening; forming a ferro-electric (FE) layer in the opening; and forming a second metal gate electrode over the FE layer.

Aspects of the present disclosure include planarizing the second metal gate down to an upper surface of the ILD and the FE layer. Further aspects include the FE layer being a FE capacitor layer. Yet additional aspects include annealing the FE layer after depositing the FE layer. Other aspects include removing the dummy gate and all of the sidewall spacers to form the opening. Further aspects include the dummy gate including polysilicon. Additional aspects include depositing hafnium zirconate (HfZrO$_4$) or halfnium oxide (HfO$_2$) as the ferro-electric (FE) layer in the opening.

Another aspect of the present disclosure is a method including: forming a gate stack over a semiconductor substrate by: forming a gate oxide over the semiconductor substrate; forming a metal gate electrode over the gate oxide; forming sidewall spacers on first and second sides of the gate stack; forming an ILD over the substrate and gate stack; forming an opening over the metal gate electrode; forming a FE layer in the opening; and forming a second metal gate electrode over the FE layer in the opening.

Aspects include forming the opening over the gate electrode by etching through the ILD down to the first metal gate electrode to form the opening. Other aspects include forming a dummy gate over the metal gate electrode. Further aspects include the dummy gate including polysilicon. Yet further aspects include removing the dummy gate to form the opening over the metal gate electrode. Other aspects include forming the first metal gate electrode with a width that is larger than a width of the second metal gate electrode. In yet another aspect, the FE layer is a FE capacitor layer. Additional aspects include depositing HfZrO$_4$ or HfO$_2$ as the FE layer.

In yet another aspect, a device is provided and includes a gate stack formed over a semiconductor substrate, the gate stack including: a gate oxide formed over the semiconductor substrate; a first metal gate electrode formed over the gate oxide; and sidewall spacers formed on first and second sides of the gate stack; an ILD formed on sides of the gate stack; a FE capacitor formed over the first metal gate electrode; and a second metal gate electrode formed over the FE capacitor.

Certain aspects include the semiconductor substrate including a silicon-on-insulator (SOI) substrate. Additional aspects include depositing HfZrO$_4$ or HfO$_2$ as the FE layer. Additional aspects include the first metal gate electrode having a width that is larger than a width of the second metal gate electrode. Other aspects include the gate oxide including a high-k dielectric.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A-2F schematically illustrate, in cross-sectional view, steps for producing a NC-FET with gate first HKMG processing, in accordance with another exemplary embodiment;

FIGS. 3A-3C schematically illustrate, in cross-sectional view, steps for producing a NC-FET with partial removal of sidewall spacers, in accordance with yet another exemplary embodiment;

FIGS. 4A-4E schematically illustrate, in cross-sectional view, steps for producing a NC-FET using a gate mask, in accordance with another exemplary embodiment;

FIGS. 5A-5D schematically illustrate, in cross-sectional view, steps for producing a NC-FET using gate last processing, in accordance with another exemplary embodiment;

FIGS. 5E-5F schematically illustrate, in top view, steps for producing the NC-FET of FIGS. 5A-5D, in accordance with another exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of capacitance matching in FET devices. In accordance with embodiments of the present disclosure, a method to produce a NC-FET using a FE material, and related device are provided.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
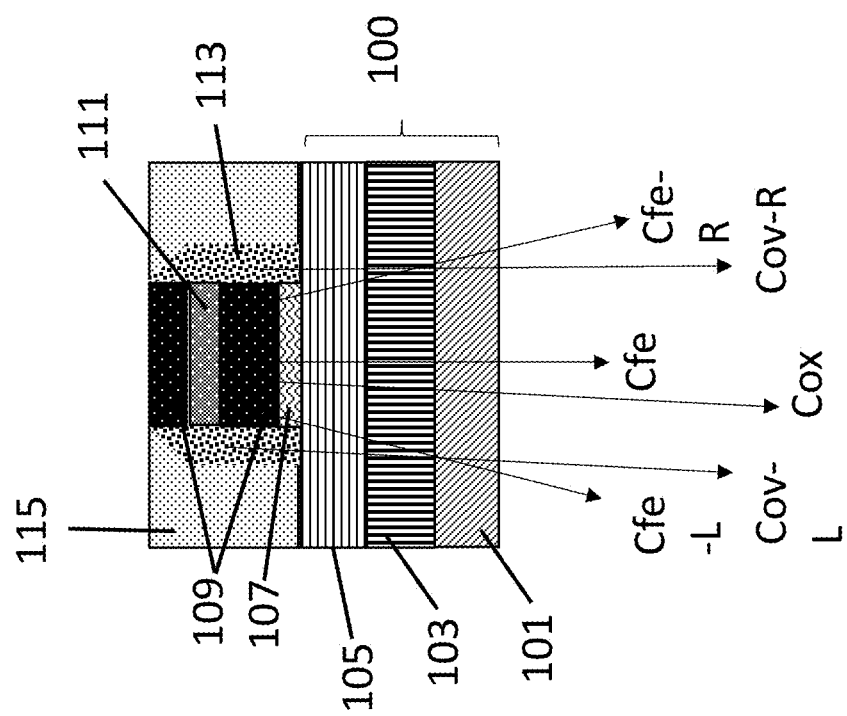
FIG. 1 illustrates a capacitance compensated NC-FET in cross-sectional view, in accordance with an exemplary embodiment.

According to FIG. 1, wherein NC-FET is illustrated. A SOI substrate 100 for the device includes Si substrate 101, insulator 103, such as a buried oxide (BOX) layer, that is deposited over the substrate 101. A Si layer 105 is deposited over the insulator 103 to complete the SOI substrate 100. Source/drain regions (not shown) are formed in the Si layer 105. A gate stack, disposed between an ILD 115, is formed over the Si layer 105 and includes a gate dielectric layer 107, metal gate 109, FE layer 111 and sidewall spacers 113. The thickness of the FE layer 111 in this example can be adjusted such that its capacitance is matched to the gate dielectric layer 107.

In FIG. 1, an example of a Miller capacitance compensated NC-FET is illustrated. As device W and L scale, capacitance of the FE (Cfe), capacitance of the gate dielectric (Cox), capacitance of depletion region (Cdep) scale accordingly, but capacitance of spacer regions Cov-L and Cov-R are kept constant, making the total Cfe to CMOS matching difficult when the device size changes. However, by introducing a calculated fix extension of the FE over the high-k dielectric and metal gate, its corresponding Cfe-L and Cfe-R help to compensate the Cov-L and Cov-R, making the total Cfe to CMOS matched and thereby maintaining the integrity of NC-FET without hysteresis for all W and L dimensions.

FIGS. 2A-2F illustrate another example for the fabrication of a NC-FET, in cross-sectional view, with high-k metal gate (HKMG) processing. A gate stack is formed over the Si layer 105 of the SOI substrate 100 and the gate stack includes a gate dielectric layer 107, metal gate 109, polysilicon dummy gate 201 and sidewall spacers 113. The gate dielectric layer 107 is a high dielectric constant (high-k) material including silicon dioxide ($SiO_2$), $HfO_2$, zirconium dioxide ($ZrO_2$) and titanium dioxide ($TiO_2$). In FIG. 2A, a CMOS is fabricated by a gate first process, with polysilicon dummy gate 201 formed over the metal gate 109. In FIG. 2B, an ILD 203 is deposited over the SOI substrate 100. In FIG. 2C, polysilicon dummy gate 201 is removed by a gate-last-like process from the gate stack to form cavity 205.

In FIG. 2D, the sidewall spacers 113 are removed from each side of the gate stack. A selective etching step can be used to remove the sidewall spacers 113 which can be formed of silicon nitride (SiN). A gap/cavity 207 is formed on each side of the gate stack. In FIG. 2E, an FE layer 209 is deposited in gap/cavity 205, a portion of gap/cavity 205 and over the ILD 203. The FE layer 209 is annealed at a temperature of 600 to 1000° C. The annealing at the lower temperature range of 600° C. leads to better SS and lower Vt hysteresis. Higher temperature annealing can lead to defect generation and Vt hysteresis. The FE layer 209 can be formed of a hafnium-based oxide, including $HfZrO_4$ and $HfO_2$ at a thickness of 2 to 15 nanometers (nm). In certain examples, the FE layer 209 is formed to a thickness of 2-3 nm.

A top metal gate 211 of the NC-FET is formed over the FE layer 209. Both the metal gate 109 and top metal gate 211 are formed of metals including TiN, TaN, W and metal silicides thereof. In this example, a tunable FE capacitor is formed by selective removal of the sidewall spacers 113 and the FE layer 209 gap fills the space created by removal of the sidewall spacers 113. The FE layer 209 helps reduce parasitic capacitance and can achieve better capacitance matching for different W/L devices. In terms of the gap fill of the FE layer 209, after removal of the polysilicon dummy gate 201, the height of the metal gate 109 is only a few nm high and the sidewall spacer width is only a few nm wide. The aspect ratio is not large and chemical vapor deposition (CVD) or atomic layer deposition (ALD) is sufficient to for gap filling with the FE layer 209. In FIG. 2F, a chemical mechanical polishing (CMP) is performed to remove excess FE layer 209 and top metal gate 211 down to an upper surface of the ILD 203. No gate pattering is performed which eliminates one mask during processing, and after the CMP step is performed, an FE capacitor 213 is formed. The FE capacitor 213 has FE spacer with smaller parasitic capacitance than conventional MOSFET's spacer parasitic capacitance which can result in a match of FE capacitance with high-K dielectric capacitance.

FIGS. 3A-3C illustrate another example for the fabrication of a NC-FET, in cross-sectional view. This alternative approach partly removes sidewall spacers 113 to avoid damage to the high-k dielectric layer 107. This alternative approach can also avoid any potential gap-fill issues as a result of completely removing the sidewall spacers 113. In FIG. 3A, the sidewall spacers 113 are partially etched down to an upper surface of metal gate 109 to form gap/cavity 301. In FIG. 3B, the FE layer 209 is deposited in gap/cavity 301, and over the ILD 203. The FE layer 209 is annealed at a temperature of 600 to 1000° C. Recessing of the FE layer 209 to adjust thickness prior to annealing is optional. The FE layer 209 can be formed of a hafnium-based oxide, including HfZrO$_4$ and HfO$_2$. A top metal gate 211 of the NC-FET is formed over the FE layer 209. In FIG. 3C, CMP is performed to remove excess FE layer 209 and top metal gate 211 down to an upper surface of the ILD 203, thereby forming the FE capacitor 213.

FIGS. 4A-4E illustrate yet another example for the fabrication of a NC-FET, in cross-sectional view. In this example, a FE capacitor is formed using a gate mask. Formation of the FE capacitor area is controlled and a larger cavity/gap can be used to enhance gap fill capability if the spacer is removed. In FIG. 4A, a CMOS process is used to form the gate stack over the SOI substrate 100. In FIG. 4B, a photoresist 401 is deposited over the ILD 203 and patterned to over the gate stack. In FIG. 4C, and etching step is performed to etch through the patterned photoresist 401 and ILD 203 to form opening 403 that extends down to the gate stack. In FIG. 4D, the FE layer 209 is deposited in opening 403 and over ILD 203. As shown in FIG. 4E, a top metal gate 211 is deposited in the remaining portion of opening 403 and CMP is performed to form FE capacitor 213.

In FIGS. 5A-5F, another example of a FE capacitor formed by a gate-last process is illustrated in cross sectional view. Fully or partly replaced FE spacer structures can also be used, however, in this example the sidewall spaces 113 are not replaced. In FIG. 5A, the FE layer 209 is formed over the metal gate 109 and ILD 203. In FIG. 5B, the top metal gate 211 is deposited over the FE layer 109. A CMP step is performed to remove excess top metal gate 211 and FE layer 209 down to an upper surface of the ILD 203 forming FE capacitor 213, as shown in FIG. 5C.

In FIG. 5D (cross-sectional view), an FE gate mask is used to define FE capacitor width. A photoresist 501 is applied over the device to pattern the FE gate width, with the length being self-aligned, as shown in FIG. 5E (top view). FIG. 5F (top view), illustrates that a different FE top gate width is achieved by etching off the FE top metal gate. A smaller FE width can reduce FE capacitance so that a relatively thin FE film can be used to enhance L scalability. An optimized device width can be designed to achieve FE capacitance matching to underlying CMOS with different L and different types.

Figure 6A:
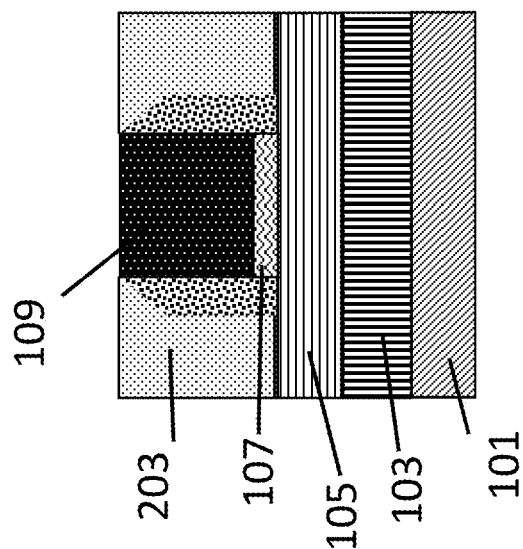
FIGS. 6A-6F schematically illustrate, in cross-sectional view, steps for producing FE capacitor formed over a CMOS gate, in accordance with yet another exemplary embodiment.
Figure 6B:
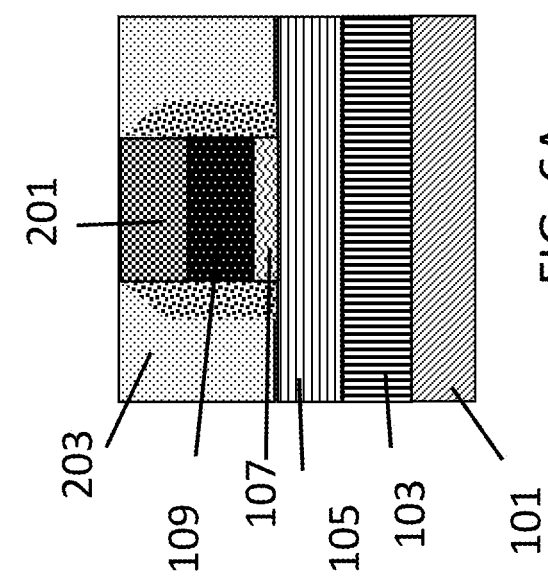
Figure 6C:
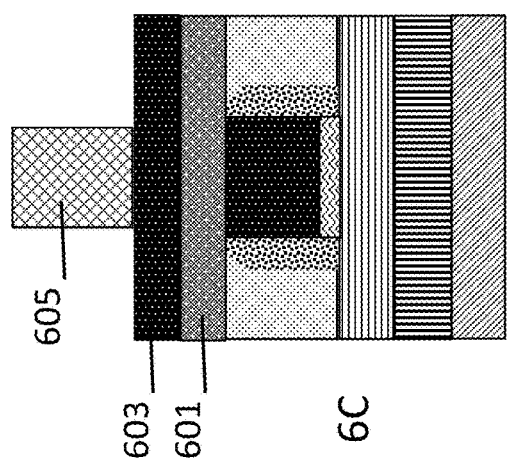
Figure 6D:
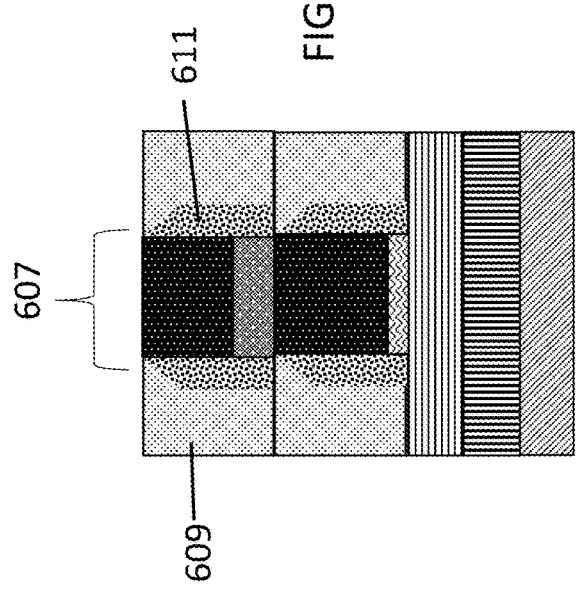
Figure 6E:
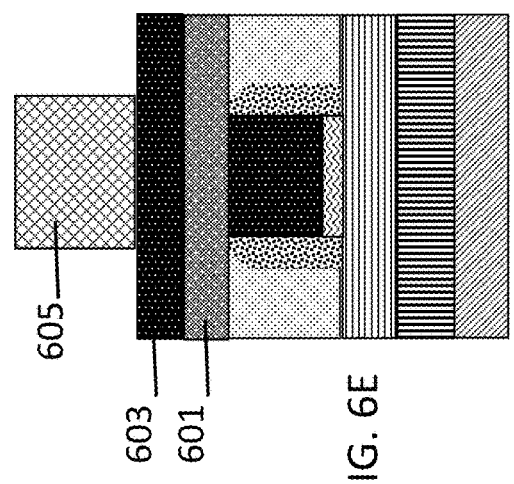
Figure 6F:
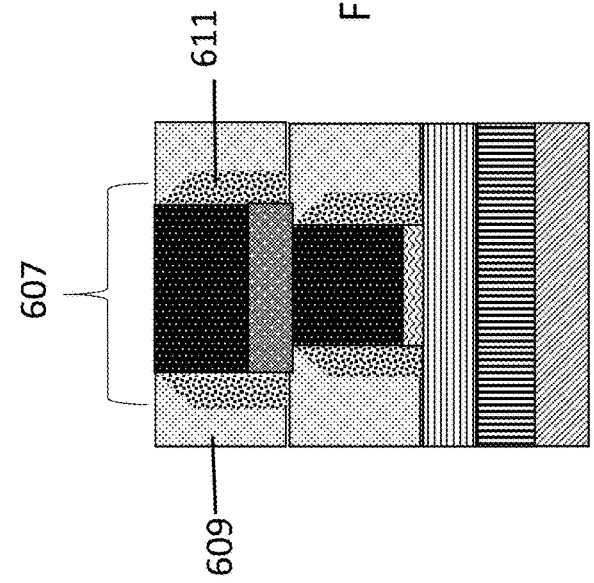

In FIGS. 6A-6F, an example of fabricating a MOSFET that is produced with a gate first high-k metal gate (HKMG) processing is illustrated in cross-sectional view. FIG. 6A and FIG. 6B represent processing up until the ILD 203 is deposited and CMP is performed. The polysilicon dummy gate 201 is optionally pulled, as shown in FIG. 6B. In the processing steps of FIGS. 6C-6F, FE capacitors are formed directly on a CMOS gate. FE capacitor can be tuned by adjusting FE layer thickness, capacitor L/W to achieve capacitance matching. In particular, FIGS. 6C and 6E, the FE layer 601 is deposited over the CMOS gate produced in FIG. 6A or 6B. The FE layer 601 is then subjected to a thermal annealing at a temperature range of 600-1000° C. The top metal gate 603 is deposited over the FE layer 601. A photoresist 605 is deposited and patterned and an etching step is performed to define the area for FE gate 607. Second ILD 609 and sidewall spacers 611 are formed and followed by standard back end of line (BEOL) processing. In FIG. 6D the area for the FE gate 607 is smaller than that shown in the wider area for FE gate 607 shown in FIG. 6F.

The embodiments of the present disclosure can achieve several technical effects including preventing FE material from undergoing high thermal processing with gate first processing, thereby preventing defects in NC and increase in Vt hysteresis. The present disclosure's proposed sequence of fabrication has the advantage of not be limited to FE thermal engineering at lower temperature ranges, as typically required from conventional gate-last n-type titanium-aluminum (TiAl) metal gate processes. Additionally, the NC-FET process of the present disclosure enables NC tuning by engineering the FE layer thickness, top metals of FE capacitors. With additional gate mask, the present disclosure provides further flexibility in tuning NC by FE thickness and metal gate area (W/L) for better matching with underlying CMOS with various W/L and different device types. Additional tuning on gate-drain capacitance is possible by selective removing SiN sidewall spacers.

Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including FET and FinFET devices in the 28 nm HKMG technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a gate stack over a semiconductor substrate by:
        forming a gate oxide over the semiconductor substrate;
        forming a first metal gate electrode over the gate oxide;

forming a dummy gate over the metal gate electrode; and forming sidewall spacers on first and second sides of the gate stack;

forming an interlayer dielectric (ILD) over the substrate and gate stack;

removing the dummy gate and at least a portion of sidewall spacers to form an opening;

forming a ferro-electric (FE) layer in the opening; and forming a second metal gate electrode over the FE layer, wherein vertical portions of the FE layer extends from an upper surface of the ILD down to the semiconductor substrate and below the first metal gate electrode, and wherein a horizontal portion of the FE layer extends between the vertical portions and separates the first metal gate electrode and the second metal gate electrode.

2. The method according to claim 1, further comprising: planarizing the second metal gate down to an upper surface of the ILD and the FE layer.

3. The method according to claim 2, wherein the FE layer comprises a FE capacitor layer.

4. The method according to claim 1, further comprising: annealing the FE layer after depositing the FE layer.

5. The method according to claim 1, further comprising: removing the dummy gate and all of the sidewall spacers to form the opening.

6. The method according to claim 5, wherein the dummy gate comprises polysilicon.

7. The method according to claim 1, further comprising: depositing hafnium zirconate (HfZrO$_4$) or HfO as the ferro-electric (FE) layer in the opening.

8. A method comprising:
forming a gate stack over a semiconductor substrate by:
forming a gate oxide over the semiconductor substrate;
forming a metal gate electrode over the gate oxide;
forming sidewall spacers on first and second sides of the gate stack;
forming an interlayer dielectric (ILD) over the substrate and gate stack;
forming an opening over the metal gate electrode;
forming a ferro-electric (FE) layer in the opening;
forming a second metal gate electrode over the FE layer in the opening;
planarizing the second metal gate electrode and FE layer down to the ILD, wherein a lower surface of the FE layer extends over upper surfaces of the sidewall spacers and the metal gate electrode.

9. The method according to claim 8, comprising:
forming the opening over the gate electrode by etching through the ILD down to the first metal gate electrode to form the opening.

10. The method according to claim 8, further comprising: forming a dummy gate over the metal gate electrode.

11. The method according to claim 9, wherein the dummy gate comprises polysilicon.

12. The method according to claim 8, further comprising: removing the dummy gate to form the opening over the metal gate electrode.

13. The method according to claim 8, comprising: forming the first metal gate electrode with a width that is larger than a width of the second metal gate electrode.

14. The method according to claim 8, wherein the FE layer comprises a FE capacitor layer.

15. The method according to claim 14, wherein the FE capacitor layer comprises hafnium zirconate (HfZrO$_4$) or HfO.

16. A device comprising:
a gate stack formed over a semiconductor substrate, the gate stack comprising:
a gate oxide formed over the semiconductor substrate;
a first metal gate electrode formed over the gate oxide; and
sidewall spacers formed on first and second sides of the gate stack;
an interlayer dielectric (ILD) formed on sides of the gate stack;
a ferro-electric (FE) capacitor formed over the first metal gate electrode; and
a second metal gate electrode formed over the FE capacitor,
wherein vertical portions of the FE capacitor extend from an upper surface of the ILD down to the semiconductor substrate and below the first metal gate electrode, and
wherein a horizontal portion of the FE capacitor extends between the vertical portions and separates the first metal gate electrode and the second metal gate electrode.

17. The device according to claim 16, wherein the semiconductor substrate comprises a silicon-on-insulator (SOI) substrate.

18. The device according to claim 16, wherein the FE capacitor layer comprises hafnium zirconate (HfZrO$_4$) or HfO.

19. The device according to claim 16, wherein the gate oxide comprises a high-k dielectric.

* * * * *